(12) United States Patent
Saita et al.

(10) Patent No.: US 7,883,905 B2
(45) Date of Patent: Feb. 8, 2011

(54) PROCESS FOR PRODUCING A BST THIN-FILM CAPACITOR HAVING INCREASED CAPACITY DENSITY AND REDUCED LEAKAGE CURRENT DENSITY

(75) Inventors: Hitoshi Saita, Tokyo (JP); Kiyoshi Uchida, Tokyo (JP); Kenji Horino, Tokyo (JP); Eri Aizawa, Tokyo (JP)

(73) Assignee: TDK Corporation, Tokyo (JP)

( * ) Notice: Subject to any disclaimer, the term of this patent is extended or adjusted under 35 U.S.C. 154(b) by 167 days.

(21) Appl. No.: 11/989,600

(22) PCT Filed: Jul. 28, 2006

(86) PCT No.: PCT/JP2006/315012
§ 371 (c)(1),
(2), (4) Date: Mar. 17, 2008

(87) PCT Pub. No.: WO2007/013604
PCT Pub. Date: Feb. 1, 2007

(65) Prior Publication Data
US 2009/0176345 A1  Jul. 9, 2009

(30) Foreign Application Priority Data
Jul. 29, 2005 (JP) .......................... P2005-222270

(51) Int. Cl.
*H01L 21/00* (2006.01)
(52) U.S. Cl. .......................................... 438/3; 257/532
(58) Field of Classification Search .............. 438/3; 257/532
See application file for complete search history.

(56) References Cited

U.S. PATENT DOCUMENTS

| 5,516,363 | A | | 5/1996 | Azuma et al. |
| 5,614,018 | A | * | 3/1997 | Azuma et al. ................ 117/68 |
| 5,853,500 | A | | 12/1998 | Joshi et al. |
| 6,153,460 | A | * | 11/2000 | Ohnishi et al. ............ 438/238 |

(Continued)

FOREIGN PATENT DOCUMENTS

JP 63215017 * 7/1988 .................... 438/3

(Continued)

OTHER PUBLICATIONS

Akedo et al.; Preparation and Evaluation of SrTiO3 Thin Films with High Dielectric Strength; *R&D Review of Toyota CRDL*; vol. 32; No. 3; Sep. 1997; pp. 61-70.

*Primary Examiner*—Thanh V Pham
*Assistant Examiner*—Caleb Henry
(74) *Attorney, Agent, or Firm*—Oliff & Berridge, PLC (57) ABSTRACT

It is an object of the invention to provide a process for production of a thin-film capacitor that can simultaneously achieve improved capacity density and reduced leakage current density for barium strontium titanate thin-films. There is provided a process for production of thin-film capacitors that includes a metal oxide thin-film forming step in which an organic dielectric starting material is fired to form a barium strontium titanate thin-film, wherein the firing atmosphere used is an oxygen-containing inert gas atmosphere, and the barium strontium titanate thin-film formed by the process has a larger capacity density than the capacity density of the barium strontium titanate thin-film fired in an oxygen atmosphere.

6 Claims, 3 Drawing Sheets

U.S. PATENT DOCUMENTS

| | | | |
|---|---|---|---|
| 6,506,613 B1 * | 1/2003 | Okudaira | 438/3 |
| 6,777,248 B1 * | 8/2004 | Nabatame et al. | 438/3 |
| 2002/0153543 A1 | 10/2002 | Kijima | |
| 2002/0195683 A1 * | 12/2002 | Kim et al. | 257/532 |

FOREIGN PATENT DOCUMENTS

| | | |
|---|---|---|
| JP | A-09-078249 | 3/1997 |
| JP | A-2000-169297 | 6/2000 |
| JP | A-2002-167281 | 6/2002 |
| JP | A-2003-299915 | 10/2003 |
| JP | A-2004-146615 | 5/2004 |
| JP | A-2004-299915 | 10/2004 |
| JP | A-2005-085812 | 3/2005 |

* cited by examiner

PROCESS FOR PRODUCING A BST THIN-FILM CAPACITOR HAVING INCREASED CAPACITY DENSITY AND REDUCED LEAKAGE CURRENT DENSITY

TECHNICAL FIELD

The present invention relates to a process for production of a thin-film capacitor, whereby a thin-film capacitor having a barium strontium titanate thin-film is produced as a dielectric layer on a substrate.

BACKGROUND ART

Major goals for enhancing the performance of charge storage parts such as thin-film capacitors in the prior art have included improving the capacity density and reducing the leakage current density of dielectric thin-films sandwiched between electrodes.

For formation of a dielectric thin-film by a wet process, first a metal oxide thin-film starting solution for the dielectric layer is applied on a surface of a substrate. The applied starting solution is then fired to form a metal oxide thin-film. Firing atmospheres used in the prior art are oxygen atmospheres to prevent oxygen deficiency of the dielectric material (for example, see Patent document 1). When strontium titanate thin-films are formed as metal oxide thin-films, on the other hand, it has been possible to reduce the leakage current density of the strontium titanate thin-films by limiting the atomic ratio of strontium atoms to titanium atoms to no greater than 1 (for example, see Non-patent document 1).

However, Non-patent document 1 also reports lower capacity density with strontium titanate thin-films when the atomic ratio strontium atoms to titanium atoms is below 1.

[Patent document 1] Japanese Patent Application Laid-Open HEI No. 9-78249

[Non-patent document 1] R&D Review of Toyota CRDL, Vol. 32, No. 3 (September 1997) pp 61-70.

DISCLOSURE OF THE INVENTION

Problems to be Solved by the Invention

It is therefore an object of this invention to provide a process for production of a thin-film capacitor that can simultaneously achieve improved capacity density and reduced leakage current density for barium strontium titanate thin-films.

Means for Solving the Problems

As a result of much ardent research conducted with the aim of achieving the object stated above, the present inventors have discovered that a barium strontium titanate thin-film with both increased capacity density and reduced leakage current density can be formed by coating a starting solution on a substrate and firing it in an oxygen-containing inert gas atmosphere with an oxygen content of less than 100%, which is surprisingly contrary to the invention of Patent document 1, and we have subsequently completed the present invention. Specifically, the process for production of a thin-film capacitor according to the invention is a thin-film capacitor production process comprising a lower electrode forming step in which a lower electrode is formed on a substrate, a starting solution coating step in which a starting solution containing a Ba-based organic dielectric starting material, a Sr-based organic dielectric starting material and a Ti-based organic dielectric starting material is coated on the surface of the lower electrode, a metal oxide thin-film forming step in which the organic dielectric starting materials in the starting solution coated onto the surface of the lower electrode are fired to form a barium strontium titanate thin-film, and an upper electrode forming step in which an upper electrode is formed on the surface of the barium strontium titanate thin-film, wherein the barium strontium titanate thin-film has the composition represented by the following formula:

$(Ba_{1-x}Sr_x)_y TiO_3$ (where $0<x<1$, $y \leq 1$), and the firing atmosphere for the barium strontium titanate thin-film in the metal oxide thin-film forming step is an oxygen-containing inert gas atmosphere, to form a barium strontium titanate thin-film with a larger capacity density than the capacity density of the barium strontium titanate thin-film formed using an oxygen atmosphere as the firing atmosphere (the barium strontium titanate thin-film fired in an oxygen atmosphere).

In the thin-film capacitor production process of the invention, the barium strontium titanate thin-film fired in the oxygen-containing inert gas atmosphere may have a leakage current density of no greater than $10^{-7}$ A/cm$^2$ at room temperature and an electric field strength of 100 kV/cm. A barium strontium titanate thin-film with a leakage current density of no greater than $10^{-7}$ A/cm$^2$ will result in a thin-film capacitor suitable as a highly reliable thin-film capacitor.

In the thin-film capacitor production process of the invention, the capacity density of the resulting barium strontium titanate thin-film formed in the oxygen-containing inert gas atmosphere (the barium strontium titanate thin-film fired in the oxygen-containing inert gas atmosphere) is at least 20% greater than the capacity density of the barium strontium titanate thin-film formed in an oxygen atmosphere (the barium strontium titanate thin-film fired in an oxygen atmosphere). Thus, by firing the barium strontium titanate thin-film in an oxygen-containing inert gas atmosphere by the thin-film capacitor production process of the invention, it is possible to increase the capacity density to at least 20% greater than according to the prior art.

In the metal oxide thin-film forming step of the thin-film capacitor production process of the invention, the firing temperature is preferably between 600° C. and 1000° C. Limiting the firing temperature to between 600° C. and 1000° C. can improve the sintering density of the barium strontium titanate thin-film. This will permit further increase in the capacity density and reduction in the leakage current density of the barium strontium titanate thin-film.

In the metal oxide thin-film forming step of the thin-film capacitor production process of the invention, the oxygen content of the oxygen-containing inert gas is preferably no greater than 20%. Limiting the oxygen content to no greater than 20% can further increase the capacity density and reduce the leakage current density of the barium strontium titanate thin-film.

In the thin-film capacitor production process of the invention, y is preferably 0.85 or greater. A y value of less than 0.85 will alter the chemical composition balance between barium/strontium atoms and titanium atoms, making it difficult to achieve a stable perovskite structure for the barium strontium titanate thin-film.

In the thin-film capacitor production process of the invention, a Mn-based organic dielectric starting material may also be added to the starting solution to include Mn element as an accessory component to the barium strontium titanate thin-film. Adding Mn element to the barium strontium titanate thin-film can increase resistance to reduction of, as well as increase the sintering density of, the barium strontium titanate thin-film.

EFFECT OF THE INVENTION

According to the invention it is possible to simultaneously achieve improved capacity density and reduced leak current density for barium strontium titanate thin-films.

EXPLANATION OF SYMBOLS

1: Substrate, 2: lower electrode, 3: barium strontium titanate thin-film, 4: upper electrode, 5: protective layer, 10: thin-film capacitor.

BEST MODE FOR CARRYING OUT THE INVENTION

The present invention will now be further explained by examples, with the understanding that the invention is not limited to the examples.

Figure 1:
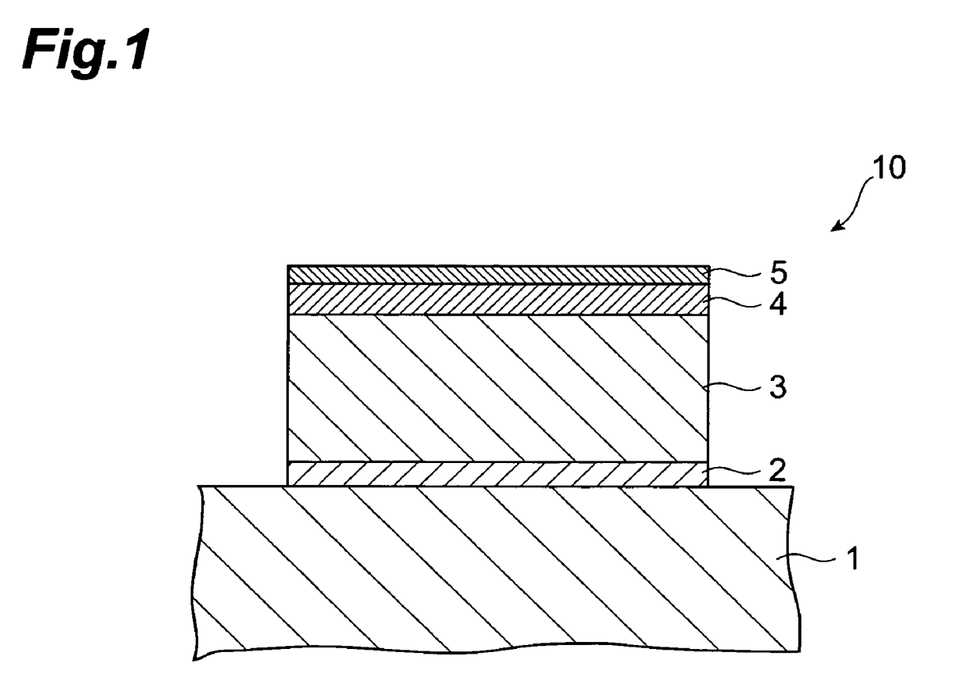
FIG. 1 is a simplified cross-sectional view of a thin-film capacitor according to an embodiment of the invention.

FIG. 1 is a simplified cross-sectional view of a thin-film capacitor 10 according to an embodiment of the invention. The thin-film capacitor 10 has a construction with a lower electrode 2, a barium strontium titanate thin-film 3 as a dielectric layer, an upper electrode 4 and a protective layer 5 laminated in that order on a substrate 1. The production process for the thin-film capacitor 10 of this embodiment comprises a lower electrode forming step in which the lower electrode 2 is formed on the substrate 1, a starting solution coating step in which a starting solution containing a Ba-based organic dielectric starting material, a Sr-based organic dielectric starting material and a Ti-based organic dielectric starting material is coated on the surface of the lower electrode 2, a metal oxide thin-film forming step in which the organic dielectric starting materials in the starting solution coated onto the surface of the lower electrode 2 are fired to form a barium strontium titanate thin-film 3, and an upper electrode forming step in which an upper electrode 4 is formed on the surface of the barium strontium titanate thin-film 3. Also included between the starting solution coating step and the metal oxide thin-film forming step is a calcining step in which at least a portion of the solvent in the coated layer of the starting solution is removed to accelerate thermal decomposition of the starting materials. Each step will now be described in detail.

(Lower Electrode Forming Step)

First, the lower electrode 2 is formed on the surface of the substrate 1 on which the barium strontium titanate thin-film 3 is to be formed.

The substrate 1 may be a silicon single crystal substrate, a ceramic polycrystalline substrate made of alumina ($Al_2O_3$), magnesia (MgO), forsterite ($2MgO.SiO_2$), steatite ($MgO.SiO_2$), mullite ($3Al_2O_3.2SiO_2$), beryllia (BeO), zirconia ($ZrO_2$), aluminum nitride (AlN), silicon nitride ($Si_3N_4$), silicon carbide (SiC), magnesia or the like, a glass ceramic substrate (LTCC substrate) made of alumina (crystal phase) and silicon oxide (glass phase) obtained by firing at below 1000° C., a glass substrate such as quartz glass, or a single crystal substrate made of sapphire MgO, $SrTiO_3$ or the like. The substrate 1 may be any one that is chemically and thermally stable and generates minimal stress, while maintaining surface smoothness. The substrate may be appropriately selected according to the desired relative permittivity and firing temperature. Preferred among the substrates mentioned above are silicon single crystal substrates which have satisfactory substrate surface smoothness. When a silicon single crystal substrate is used, it is preferred to form a thermal oxidation film ($SiO_2$ film) on its surface to ensure insulation. The thermal oxidation film is formed by bringing the silicon substrate to a high temperature to oxidize the surface of the silicon single crystal substrate in an oxidizing atmosphere. The thickness of the substrate 1 is not particularly restricted and may be, for example, 100-1000 μm.

The surface of the substrate 1 may also be smoothed by mirror finishing (polishing) involving substrate rubbing, CMP (Chemical Mechanical Polishing) or the like. Via electrodes may also be formed if necessary in the substrate 1.

The lower electrode material may be any low-resistance material. According to the invention, this may be a metal such as platinum (Pt), gold (Au), silver (Ag), iridium (Ir), ruthenium (Ru), cobalt (Co) or iron (Fe), or an alloy containing it, a conductive semiconductor such as silicon (Si), gallium-arsenic (GaAs), gallium-phosphorus (GaP), indium-phosphorus (InP), silicon carbide (SiC) or the like, or a metal oxide electric conductor such as indium tin oxide (ITO), zinc oxide (ZnO), tin oxide ($SnO_2$), indium oxide ($In_2O_3$), iridium dioxide ($IrO_2$), ruthenium dioxide ($RuO_2$), rhenium trioxide ($ReO_3$), LSCO ($La_{0.5}Sr_{0.5}CoO_3$) or the like.

When firing is carried out in an inert gas atmosphere, the lower electrode material of the lower electrode 2 may be, for example, a metal containing nickel (Ni) as a base metal material, or a metal such as copper (Cu) or aluminum (Al), or an alloy of the above.

The lower electrode 2 is usually formed by a thin-film forming process, but alternatively a physical vapor deposition process such as physical vapor deposition (PVD) or pulse laser vapor deposition (PLD) may be used. Examples of PVD processes include vacuum deposition processes such as resistance heating vapor deposition or electron beam thermal vapor deposition, various sputtering processes such as DC sputtering, high-frequency sputtering, magnetron sputtering, ECR sputtering or ion beam sputtering, various ion plating processes such as high-frequency ion plating, activation vapor deposition or arc ion plating, as well as molecular beam epitaxy, laser ablation, ionized cluster beam vapor deposition and ion beam vapor deposition.

The thickness of the lower electrode 2 is not particularly restricted but is preferably 10-1000 nm and more preferably about 50-200 nm.

For improved adhesiveness between the substrate 1 and lower electrode 2, an adhesive layer (not shown) may be formed before forming the lower electrode 2. An adhesive layer is formed using an oxide or nitride of Ti, Ta, Co, Ni, Hf, Mo, W or the like. The adhesive layer may be formed using a vapor deposition process such as PVD or PLD, or chemical vapor deposition (CVD).

(Starting Solution Coating Step)

A starting solution containing the organic dielectric starting materials is then coated onto the surface of the lower electrode 2 to form the barium strontium titanate thin-film 3.

Those skilled in the art will understand that organic dielectric starting materials are compounds that can form metal oxides as dielectric materials by thermal decomposition. For example, a metal organic acid salt may be used as an organic dielectric starting material. Typically, Ba-based organic dielectric starting materials are organic acid salts of Ba, Sr-based organic dielectric starting materials are organic acid salts of Sr, and Ti-based organic dielectric starting materials are organic acid salts of Ti. The organic acids of the organic acid salts are preferably carboxylic acids such as 2-ethylhexanoic acid, for example. For this embodiment, the barium strontium titanate thin-film 3 was formed by a wet process. The wet process may be, for example, a sol-gel process or metal organic decomposition (MOD) process. The following explanation of this embodiment will assume formation of the barium strontium titanate thin-film 3 as a dielectric thin-film by MOD. MOD is widely employed because of its advantages that include (1) allowing homogeneous mixture on the atomic level, (2) easy compositional control and excellent reproducibility, (3) allowing large-surface-area films to be formed at ordinary pressure without requiring special vacuum devices, and (4) low industrial cost. A method of forming the barium strontium titanate thin-film 3 by MOD will now be explained.

When the barium strontium titanate thin-film 3 is, for example, a barium strontium titanate film with a composition of the formula: $(Ba_{0.7}Sr_{0.3})TiO_3$, solutions containing three starting materials, specifically a titanium-based organic dielectric starting material (such as Ti 2-ethylhexanoate), a barium-based organic dielectric starting material (such as Ba 2-ethylhexanoate) and a strontium-based organic dielectric material (such as Sr 2-ethylhexanoate) are mixed to a prescribed component ratio and the mixture is diluted with toluene to obtain a starting solution. The concentration of the starting solution may be altered as appropriate so long as the molar ratio of Ba, Sr and Ti is maintained. Toluene was used as the solvent in this case, but it may be changed as appropriate depending on the type of organic dielectric starting materials. Other examples include n-isopropyl alcohol, n-butanol and n-pentyl alcohol. The starting solution may also contain a Mn-based organic dielectric starting material. Adding a Mn-based organic dielectric starting material to the starting solution provides Mn element as an accessory component to the barium strontium titanate thin-film, for reduction resistance and increased sintering density. When a Mn-based organic dielectric starting material is added to the starting solution, it is preferably added in an amount such that the number of Mn atoms is 0.01-0.02 with respect to 1 as the total of Ti and Mn atoms. The Mn-based organic dielectric starting material may be added to the starting solution as Mn 2-ethylhexanoate, for example. Other additives may also be included in the starting solution as accessory components, within a range that does not reduce the effect of the invention.

The BST mentioned above is merely provided as an example where this barium strontium titanate thin-film 3 is a (strong) dielectric material having a perovskite structure represented by the compositional formula $(Ba_{1-x}Sr_x)_yTiO_3$ (where $0<x<1$, $y\leq1$). The condition $y\leq1$ is specified because, in the case of strontium titanate thin-films among the metal oxide thin-films reported in Non-patent document 1, the leakage current density of such strontium titanate thin-films is reduced by limiting the ratio of the number of strontium atoms to titanium atoms to no greater than 1. A low leakage current density is ensured for this embodiment by the condition $y\leq1$ for the compositional ratio. Also preferred for this compositional ratio is for y to be at least 0.85. A y value of less than 0.85 will alter the chemical composition balance between barium/strontium atoms and titanium atoms, making it difficult to achieve a stable perovskite structure for the barium strontium titanate thin-film.

The starting solution is then coated onto the surface of the lower electrode 2 to obtain a coated layer. The coating method is not particularly restricted, and may be spin coating, dip coating, spraying or the like. The conditions for spin coating, for example, are not particularly restricted and a rotation rate may be selected as appropriate. A single application can form a coated film of approximately 5-600 nm.

(Calcining Step)

In the calcining step, preferably at least a portion of the solvent in the coated layer is removed to further accelerate thermal decomposition of the starting materials. Drying is performed in air to evaporate off the solvent in the coated layer. Alternatively, drying may be performed in an oxygen atmosphere. The temperature conditions are from room temperature to 200° C. for about 1-10 minutes, to inhibit surface roughening of the coated layer that tends to occur with volatilization of the solvent. Thermal decomposition of the starting materials is promoted by heating at 300-500° C. to remove the organic matter in the coated layer.

(Metal Oxide Thin-Film Forming Step)

The coated layer on the surface of the lower electrode 2 is then fired by heating in an oxygen-containing inert gas atmosphere for further thermal decomposition of the organic dielectric starting materials, until crystallization. This accomplishes firing of the barium strontium titanate thin-film. The oxygen-containing inert gas is preferably a gas composed of an inert gas and oxygen at 0-20 vol % of the total. An "inert gas" is a gas such as nitrogen, argon or helium. Traces of other gases may also be present in the firing atmosphere so long as the effect of the invention is not significantly hindered. For example, hydrogen or water vapor may be used at a concentration below the explosion limit to achieve low oxygen partial pressure. The oxygen-containing inert gas used may be, for example, a mixed gas of nitrogen and oxygen, a mixed gas of argon and oxygen, a mixed gas of helium and oxygen or a mixed gas of nitrogen, argon, helium and oxygen. The oxygen content of the oxygen-containing inert gas is appropriately adjusted so that the capacity density of the formed barium strontium titanate thin-film is greater than the capacity density of the barium strontium titanate thin-film formed in an oxygen atmosphere. Firing of metal oxide thin-films according to the prior art has been carried out by thermal decomposition of the organic dielectric starting materials in an oxygen atmosphere in order to prevent oxygen deficiency of the dielectric material. For this embodiment, however, the oxygen content of the oxygen-containing inert gas is preferably no greater than 20%. The oxygen content of the oxygen-containing inert gas is more preferably no greater than 10%. Also for this embodiment, the barium strontium titanate thin-film 3 is formed by firing to crystallization not in an oxygen atmosphere but in an oxygen-containing inert gas atmosphere, thereby accelerating grain growth of the barium strontium titanate thin-film 3 and resulting in a barium strontium titanate thin-film 3 with a greater capacity density than the capacity density of the barium strontium titanate thin-film fired in an oxygen atmosphere. Stated differently, the capacity density of a barium strontium titanate thin-film obtained by the process of this embodiment is greater than the capacity density of a barium strontium titanate thin-film having the same composition and formed at the same firing temperature in a firing atmosphere with a 100% oxygen content. According to this embodiment, a barium strontium titanate thin-film represented by the compositional formula $(Ba_{1-x}Sr_x)_yTiO_3$ (where $0<x<1$, $y\leq1$) has a low leakage current density by the specified condition of $y\leq1$, while firing of the barium strontium titanate thin-film in an oxygen-containing inert gas atmosphere instead of in an oxygen atmosphere prevents reduction in and further increases the capacity density. Moreover, the leakage current density is sufficiently reduced to no greater than $10^{-7}$ (A/cm$^2$) by conditions of room temperature and an electric field strength of 100 kV/cm, in order to form a barium strontium titanate thin-film with a satisfactory balance of high capacity density and low leakage current density. Although a low leakage current density is preferred, the lower limit is generally about $10^{-10}$ A/cm$^2$. Furthermore, adding Mn element to the barium strontium titanate thin-film can increase resistance to reduction and increase the sintering density. Addition of Mn element to the barium strontium titanate thin-film is also effective for reducing the leakage current density. In addition, by limiting the oxygen content of the oxygen-containing inert gas to no greater than 20% it is possible to further improve the capacity density to at least 20% greater than the capacity density of the barium strontium titanate thin-film fired in an oxygen atmosphere. A large increase in capacity density is preferred, but the upper limit has generally been about 400%.

The firing temperature in the metal oxide thin-film forming step is preferably 600-1000° C. The sintering density will tend to be reduced at below 600° C. On the other hand, heating at higher than 1000° C. may increase irregularities in the film surface by grain growth, and produce deformation in the substrate. Alterations in the composition of the film surface may also occur. The firing time is preferably about 5 minutes-2 hours. If the firing time is too short, the organic materials will fail to decompose sufficiently and will tend to remain in the film, while the sintering density will also fail to increase, resulting in an impaired leakage characteristic. With an excessive firing time, the film properties are not compromised but the processing time is lengthened.

Each coating/thermal decomposition cycle or coating/thermal decomposition/crystallization cycle is preferably set so that the thickness of the barium strontium titanate thin-film 3 is no greater than 600 nm, more preferably no greater than 200 nm and even more preferably 10-200 nm. For greater thicknesses, it is preferred to repeat the coating/thermal decomposition or the coating/thermal decomposition/crystallization. This is because high thicknesses for each coating layer can lead to problems such as cracking. In addition, the resulting dielectric thin-film may not be satisfactorily crystallized. On the other hand, reducing thickness excessively for each coating layer can lead to an economical disadvantage, because it will become necessary to repeatedly perform the firing to obtain a dielectric thin-film with the desired thickness.

The steps described above are repeated until a barium strontium titanate thin-film 3 with a final film thickness of about 30-1000 nm is obtained. Firing of the barium strontium titanate thin-film 3 in an oxygen-containing inert gas atmosphere can further increase the capacity density to be greater than the capacity density of the barium strontium titanate thin-film fired in an oxygen atmosphere. Moreover, the leakage current density of the barium strontium titanate thin-film 3 can be sufficiently reduced to no greater than $10^{-7}$ A/cm$^2$ by conditions of room temperature and an electric field strength of 100 kV/cm. If the film thickness of the barium strontium titanate thin-film 3 exceeds 1000 nm, the capacity density will fail to increase, tending to prevent high capacity from being achieved.

The calcining step, metal oxide thin-film forming step and crystallization step may each be carried out first at a reduced temperature and then subsequently at increased temperature by heating under prescribed conditions, or each step may be carried out continuously with consecutive temperature increases.

(Upper Electrode Formation)

The upper electrode 4 is therefore formed by sputtering or the like. The film thickness of the upper electrode 4 is not particularly restricted but is preferably set between 50 nm and 500 nm. The material of the upper electrode 4 may be any of the materials mentioned for the lower electrode, but it is preferably the same material as the electrode material of the lower electrode 2. However, when no high-temperature firing is carried out in the steps after completion of firing of the barium strontium titanate thin-film 3, an electrode material composed mainly of Cu, Al or Ni may be used. Formation of the upper electrode 4 may be followed by annealing treatment. Annealing treatment may be carried out at pO$_2$=20-100% and a temperature of 200-1000° C. (preferably 400-1000° C.). If necessary, a passivation layer 5 (protective layer) may also be formed. The material of the passivation layer 5 may be an inorganic material such as SiO$_2$ or Al$_2$O$_3$, or an organic material such as an epoxy resin, polyimide resin or the like. Each formed layer may, incidentally, be patterned in a prescribed manner using a photolithography technique. The steps described above yield a thin-film capacitor 10 comprising a barium strontium titanate thin-film 3 according to the present embodiment. Additives may also be included in the dielectric material so long as they do not hinder the effect of the invention.

The thin-film capacitor 10 shown in FIG. 1 can be obtained by forming the lower electrode 2, barium strontium titanate thin-film 3 and upper electrode 4 in that order on the substrate 1. The thin-film capacitor 10 has a single-layer barium strontium titanate thin-film 3, but a laminated thin-film capacitor with multilayers of barium strontium titanate thin-films can also be fabricated by providing a plurality of barium strontium titanate thin-films and an inner electrode between the lower electrode and upper electrode.

The invention will now be explained in further detail using specific examples, although the invention is not limited to these examples.

EXAMPLES

Preparation of Starting Solution

First, a starting solution for formation of a dielectric thin-film was prepared. For this example, barium strontium titanate thin-films were formed as barium strontium titanate thin-films represented by the compositional formula (Ba$_{1-x}$Sr$_x$)$_y$TiO$_3$ (where $0<x<1$, $y\leq1$), with the five sets of x and y shown in Table 1. The concentration of the starting solution may be altered as appropriate so long as the molar ratio of Ba, Sr and Ti is maintained. In a cleanroom, these starting solutions were filtered with a PTFE syringe filter having a pore size of 0.2 µm into a clean glass vessel. The Ba-based organic dielectric material was barium 2-ethylhexanoate, the Sr-based organic dielectric material was strontium 2-ethylhexanoate and the Ti-based organic dielectric material was titanium 2-ethylhexanoate. Their mixing ratios were adjusted for the prescribed values of x and y.

TABLE 1

| Starting solution No. | 1 | 2 | 3 | 4 | 5 |
|---|---|---|---|---|---|
| x | 0.3 | 0.3 | 0.3 | 0.3 | 0.3 |
| y | 0.9 | 0.95 | 0.97 | 1.0 | 1.03 |

(Substrates)

Substrates were prepared for formation of dielectric thin-films. A silicon single crystal substrate was used for each substrate. After laminating SiO$_2$ on the substrate surface by thermal oxidation treatment to form an oxide film (insulating layer), TiO$_2$ was laminated on the insulating layer to form an adhesive layer for satisfactory adhesiveness between the dielectric thin-film and substrate. The film thickness of the insulating layer was 0.5 µm, and the film thickness of the adhesive layer was 0.2 µm. A Pt thin-film as a lower electrode was formed to a thickness of 100 nm by sputtering. The thickness of the substrate was 2 mm, and its area was 10 mm×10 mm.

(Coating)

The starting solutions shown in Table 1 were coated onto each lower electrode, using spin coating as the coating method. Specifically, the substrate was placed in a spin coater, about 10 µl of each starting solution was added to the surface of the lower electrode, and spin coating was performed at 4000 rpm for 20 seconds to form a coated layer on the surface of the lower electrode.

(Calcination)

Calcination (thermal decomposition of the starting materials) was then performed in a 380° C. oxygen atmosphere for 10 minutes.

(Metal Oxide Thin-Film Formation)

The substrate was placed in a rapid thermal annealing furnace (RTA furnace) for further thermal decomposition and crystallization of the coated layer to form a barium strontium titanate thin-film. The firing temperature was 900-950° C. and the firing atmosphere was changed from an oxygen atmosphere to an oxygen-containing inert gas atmosphere comprising nitrogen and oxygen, for firing of the barium strontium titanate thin-film. This resulted in thermal decomposition and crystallization of the coated layer to yield a barium strontium titanate thin-film. The three steps of spin coating, thermal decomposition and calcination were repeated several times to increase the thickness of the barium strontium titanate thin-film to the prescribed film thickness. The final film thickness was 120 nm. Starting solutions #1, #2, #3 and #4 shown in Table 1 were each fired with firing atmosphere oxygen contents of 0%, 5%, 10% and 20%, for examples of four barium strontium titanate thin-films. Also, starting solutions #1, #2, #3, #4 and #5 shown in Table 1 were each fired with a firing atmosphere oxygen content of 100%, as comparative examples of barium strontium titanate thin-films. The examples and comparative examples are shown in Table 2. The chemical compositions of the formed barium strontium titanate thin-films were confirmed to be the target chemical compositions by fluorescent X-ray analysis.

TABLE 2

| | Compositional formula $(Ba_{1-x}Sr_x)_yTiO_3$ | | Firing atmosphere |
|---|---|---|---|
| | x | y | oxygen content (%) |
| Comp. Ex. 1 | 0.3 | 0.9 | 100 |
| Example 1 | 0.3 | 0.9 | 20 |
| Example 2 | 0.3 | 0.9 | 10 |
| Example 3 | 0.3 | 0.9 | 5 |
| Example 4 | 0.3 | 0.9 | 0 |
| Comp. Ex. 2 | 0.3 | 0.95 | 100 |
| Example 5 | 0.3 | 0.95 | 20 |
| Example 6 | 0.3 | 0.95 | 10 |
| Example 7 | 0.3 | 0.95 | 5 |
| Example 8 | 0.3 | 0.95 | 0 |
| Comp. Ex. 3 | 0.3 | 0.97 | 100 |
| Example 9 | 0.3 | 0.97 | 20 |
| Example 10 | 0.3 | 0.97 | 10 |
| Example 11 | 0.3 | 0.97 | 5 |
| Example 12 | 0.3 | 0.97 | 0 |
| Comp. Ex. 4 | 0.3 | 1.0 | 100 |
| Example 13 | 0.3 | 1.0 | 20 |
| Example 14 | 0.3 | 1.0 | 10 |
| Example 15 | 0.3 | 1.0 | 5 |
| Example 16 | 0.3 | 1.0 | 0 |
| Comp. Ex. 5 | 0.3 | 1.03 | 100 |

(Evaluation of Electrical Characteristic Values)

Figure 2:
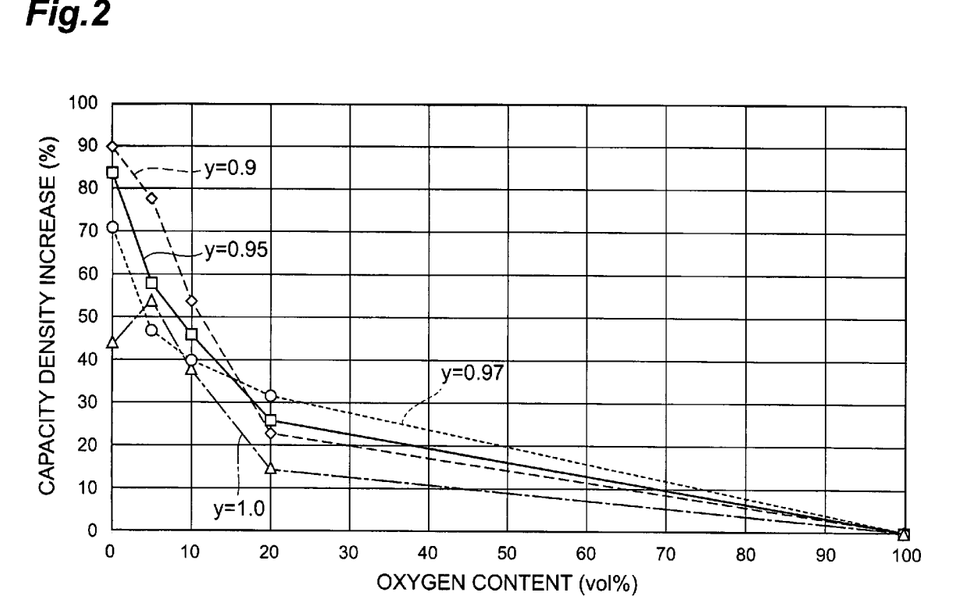
FIG. 2 is a graph showing change in capacity density increase with respect to firing atmosphere oxygen content.

The electrical characteristic values of Examples 1 to 16 and Comparative Examples 1 to 5 were evaluated. For evaluation of the electrical characteristics values, a ɸ0.1 mm Pt thin-film was formed on the barium strontium titanate thin-film to a thickness of 200 nm by sputtering, as an upper electrode. The electrical characteristic values measured were the capacity density, the dielectric loss (tan δ) and the leakage current density, under room temperature conditions. The capacity density was measured using a YHP4194A impedance analyzer (Agilent) in a range of 100 Hz to 15 MHz. The tan δ was measured using a YHP4194A impedance analyzer at 1 kHz. The leakage current density was measured using a 4156C semiconductor parameter analyzer (Agilent), under conditions of room temperature and an electric field strength of 100 kV/cm. The results are shown in Tables 3 to 6. FIG. 2 is a graph showing change in capacity density increase with respect to firing atmosphere oxygen content. In FIG. 2, the horizontal axis represents the firing atmosphere oxygen content and the vertical axis represents the capacity density increase for Tables 3 to 6.

TABLE 3

| | | Compositional formula $(Ba_{1-x}Sr_x)_yTiO_3$ | | Capacity density 1 kHz ($\mu F/cm^2$) Room temperature | tanδ (%) Room temperature | Leakage current density 100 kV/cm ($\times 10^{-8} A/cm^2$) Room temperature | Firing atmosphere oxygen content (%) | Capacity density increase within group (%) |
|---|---|---|---|---|---|---|---|---|
| | | x | y | | | | | |
| Group 1 | Comp. Ex. 1 | 0.3 | 0.9 | 1.73 | 2.61 | 2.25 | 100 | |
| | Example 1 | 0.3 | 0.9 | 2.13 | 3.07 | 2.58 | 20 | 23 |
| | Example 2 | 0.3 | 0.9 | 2.66 | 3.68 | 3.17 | 10 | 54 |
| | Example 3 | 0.3 | 0.9 | 3.08 | 3.71 | 2.90 | 5 | 78 |
| | Example 4 | 0.3 | 0.9 | 3.29 | 4.04 | 3.29 | 0 | 90 |

TABLE 4

| | | Compositional formula $(Ba_{1-x}Sr_x)_y TiO_3$ | | Capacity density 1 kHz ($\mu F/cm^2$) Room temperature | tan$\delta$ (%) Room temperature | Leakage current density 100 kV/cm ($\times 10^{-8}$ A/cm$^2$) Room temperature | Firing atmosphere oxygen content (%) | Capacity density increase within group (%) |
|---|---|---|---|---|---|---|---|---|
| | | x | y | | | | | |
| Group 2 | Comp. Ex. 2 | 0.3 | 0.95 | 2.59 | 3.42 | 2.75 | 100 | |
| | Example 5 | 0.3 | 0.95 | 3.27 | 4.13 | 2.99 | 20 | 26 |
| | Example 6 | 0.3 | 0.95 | 3.78 | 5.10 | 4.69 | 10 | 46 |
| | Example 7 | 0.3 | 0.95 | 4.09 | 5.27 | 6.17 | 5 | 58 |
| | Example 8 | 0.3 | 0.95 | 4.76 | 8.11 | 43.3 | 0 | 84 |

TABLE 5

| | | Compositional formula $(Ba_{1-x}Sr_x)_y TiO_3$ | | Capacity density 1 kHz ($\mu F/cm^2$) Room temperature | tan$\delta$ (%) Room temperature | Leakage current density 100 kV/cm ($\times 10^{-8}$ A/cm$^2$) Room temperature | Firing atmosphere oxygen content (%) | Capacity density increase within group (%) |
|---|---|---|---|---|---|---|---|---|
| | | x | y | | | | | |
| Group 3 | Comp. Ex. 3 | 0.3 | 0.97 | 2.81 | 4.07 | 3.26 | 100 | |
| | Example 9 | 0.3 | 0.97 | 3.70 | 4.72 | 4.98 | 20 | 32 |
| | Example 10 | 0.3 | 0.97 | 3.94 | 5.15 | 4.62 | 10 | 40 |
| | Example 11 | 0.3 | 0.97 | 4.13 | 5.51 | 35.0 | 5 | 47 |
| | Example 12 | 0.3 | 0.97 | 4.81 | 18.08 | 99.8 | 0 | 71 |

TABLE 6

| | | Compositional formula $(Ba_{1-x}Sr_x)_y TiO_3$ | | Capacity density 1 kHz ($\mu F/cm^2$) Room temperature | tan$\delta$ (%) Room temperature | Leakage current density 100 kV/cm ($\times 10^{-8}$ A/cm$^2$) Room temperature | Firing atmosphere oxygen content (%) | Capacity density increase within group (%) |
|---|---|---|---|---|---|---|---|---|
| | | x | y | | | | | |
| Group 4 | Comp. Ex. 4 | 0.3 | 1.0 | 3.25 | 4.60 | 2.62 | 100 | |
| | Example 13 | 0.3 | 1.0 | 3.75 | 5.83 | 4.51 | 20 | 15 |
| | Example 14 | 0.3 | 1.0 | 4.48 | 5.82 | 7.63 | 10 | 38 |
| | Example 15 | 0.3 | 1.0 | 5.0 | 7.95 | 38.6 | 5 | 54 |
| | Example 16 | 0.3 | 1.0 | 4.69 | 11.77 | 16.9 | 0 | 44 |
| Comp. Ex. 5 | | 0.3 | 1.03 | 4.73 | 6.70 | 416 | 100 | |

Tables 3, 4, 5 and 6 show that the films with a y value of 1 or smaller, i.e. where the atomic ratio represented by the sum of the number of barium atoms and the number of strontium atoms divided by the number of titanium atoms was 1 or smaller, had notably reduced leakage current densities compared to the leakage current densities of Comparative Examples 1 to 5. This is suggested by the fact that reduced leakage current density of strontium titanate thin-films has been realized by limiting the atomic ratio represented by the sum of the number of barium atoms and the number of strontium atoms divided by the number of titanium atoms to no greater than 1 for strontium titanate thin-films, among metal oxide thin-films, as explained above under Background Art. In Comparative Examples 1 to 4, however, the capacity density was lower with reduced atomic ratio, and therefore these barium strontium titanate thin-films exhibit insufficient capacity density, which is an important thin-film capacitor characteristic for application in a thin-film capacitor.

On the other hand, Examples 1-12 and Examples 14-16 exhibited increase of at least 20% in the capacity density over the comparative examples in each group. In the prior art, metal oxide thin-films have been formed by firing of organic dielectric starting materials in an oxygen atmosphere in order to prevent oxygen deficiency of the dielectric materials. However, by carrying out the firing for part of the thermal decomposition and for the crystallization in an oxygen-containing inert gas, it is possible to increase the capacity density of the barium strontium titanate thin-film above the capacity density of the barium strontium titanate thin-film fired in an oxygen atmosphere. The leakage current density of the barium strontium titanate thin-film can also be sufficiently reduced. FIG. 2 shows that reducing the oxygen content of the firing atmosphere to no higher than 20% notably augmented the increase in the capacity density for each group. It is more preferred to limit the oxygen content of the firing atmosphere to no greater than 10%, although the lower limit for the oxygen content is 0%.

Upon observing the surface of the barium strontium titanate thin-film with a probe microscope (SPI3800N, Seiko Instruments, Inc.), it was found that grain growth was accelerated with a reduced oxygen content of the firing atmosphere. It is believed that this grain growth is one reason for the increased capacity density.

Figure 3:
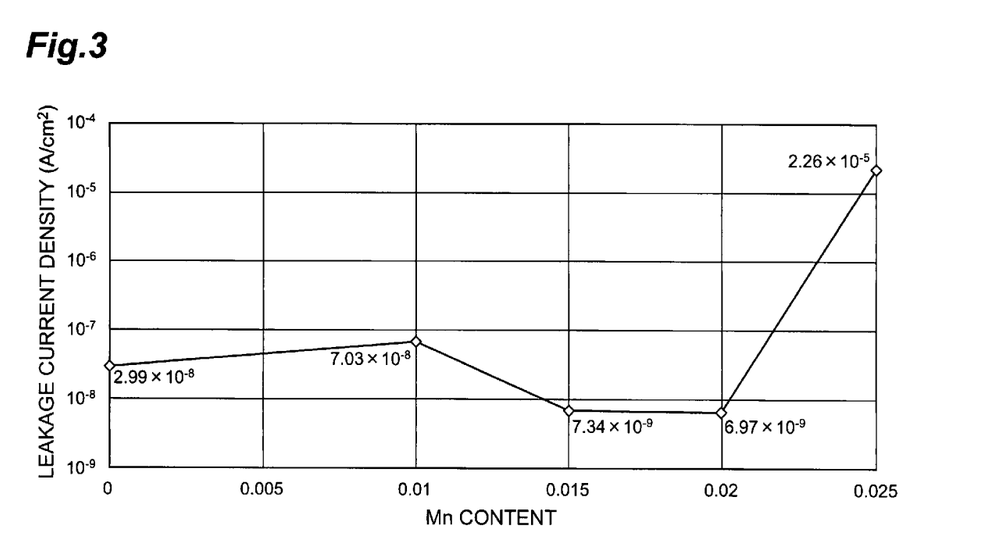
FIG. 3 is a graph showing change in leakage current density with respect to the Mn element content of a barium strontium titanate thin-film.

As an additional example, a Mn-based organic dielectric starting material was added to the starting solution in the coating step to include Mn element as an accessory component in the barium strontium titanate thin-film. The Mn-based organic dielectric starting material was added to the starting solution as Mn 2-ethylhexanoate. Barium strontium titanate thin-films were formed as barium strontium titanate thin-films represented by the compositional formula $(Ba_{1-x}Sr_x)_y Ti_{1-z}Mn_zO_3$ (where $0<x<1, y\leq1$), having fixed (x, y) values of (0.3, 0.95) and the z value changed to 0, 0.01, 0.015, 0.02 or 0.025. The barium strontium titanate thin-films were formed by the coating step described above, a degreasing step and a metal oxide thin-film forming step. FIG. 3 is a graph showing change in leakage current density with respect to the Mn element content. The graph in FIG. 3 shows the results for a firing atmosphere oxygen content of 20%. In FIG. 3, the horizontal axis represents the Mn element content (the z value in the compositional formula). The vertical axis represents the leakage current density.

It may be concluded from FIG. 3 that the leakage current density of a barium strontium titanate thin-film is notably reduced by increasing the Mn element content of the barium strontium titanate thin-film from 0.01. It was also shown that a range of $0.01\leq z\leq 0.02$ is preferred for a reduced leakage current density.

The invention claimed is:

1. A process for production of a thin-film capacitor comprising a lower electrode forming step in which a lower electrode is formed on a substrate, a starting solution coating step in which a starting solution containing a Ba-based organic dielectric starting material, a Sr-based organic dielectric starting material and a Ti-based organic dielectric starting material is coated on the surface of the lower electrode, a metal oxide thin-film forming step in which the organic dielectric starting materials in the starting solution coated onto the surface of the lower electrode are fired to form a barium strontium titanate thin-film, and an upper electrode forming step in which an upper electrode is formed on the surface of the barium strontium titanate thin-film, wherein the barium strontium titanate thin-film has the composition represented by the following formula:

$(Ba_{1-x}Sr_x)_y TiO_3$ (where $0<x<1, y<1$), the firing atmosphere for the barium strontium titanate thin-film in the metal oxide thin-film forming step is an oxygen-containing inert gas atmosphere, to form a barium strontium titanate thin-film with a larger capacity density than the capacity density of the barium strontium titanate thin-film formed using an oxygen atmosphere as the firing atmosphere, and the barium strontium titanate thin-film fired in the oxygen-containing inert gas atmosphere has a leakage current density of no greater than $10^{-7}$ A/cm² at room temperature and an electric field strength of 100 kV/cm.

2. A process for production of a thin-film capacitor according to claim 1, wherein the capacity density of the barium strontium titanate thin-film formed in the oxygen-containing inert gas atmosphere is at least 20% greater than the capacity density of the barium strontium titanate thin-film formed in an oxygen atmosphere.

3. A process for production of a thin-film capacitor according to claim 1, wherein the firing temperature in the metal oxide thin-film forming step is between 600° C. and 1000° C.

4. A process for production of a thin-film capacitor according to claim 1, wherein the oxygen content of the oxygen-containing inert gas in the metal oxide thin-film forming step is no greater than 20%.

5. A process for production of a thin-film capacitor according to claim 1, wherein the starting solution contains a Mn-based organic dielectric starting material to include Mn element as an accessory component in the barium strontium titanate thin-film.

6. A process for production of a thin-film capacitor according to claim 1, wherein $0.85\leq y<1$.

* * * * *